US008900472B2

(12) United States Patent
Mayer et al.

(10) Patent No.: US 8,900,472 B2
(45) Date of Patent: Dec. 2, 2014

(54) TEXTURING AND CLEANING AGENT FOR THE SURFACE TREATMENT OF WAFERS AND USE THEREOF

(75) Inventors: Kuno Mayer, Frankfurt/Main (DE); Mark Schumann, Freiburg (DE); Daniel Kray, Freiburg (DE); Teresa Orellana Peres, Freiburg (DE); Jochen Rentsch, Emmendingen (DE); Martin Zimmer, Freiburg (DE); Elias Kirchgässner, Freiburg (DE); Eva Zimmer, Freiburg (DE); Daniel Biro, Freiburg (DE); Arpad Mihai Rostas, Freiburg (DE); Filip Granek, Freiburg (DE)

(73) Assignee: Fraunhofer-Gesellschaft zur Foerderung der angewandten Forschung E.V., München (DE)

( * ) Notice: Subject to any disclaimer, the term of this patent is extended or adjusted under 35 U.S.C. 154(b) by 401 days.

(21) Appl. No.: 12/792,284

(22) Filed: Jun. 2, 2010

(65) Prior Publication Data
US 2011/0092074 A1 Apr. 21, 2011

Related U.S. Application Data

(63) Continuation-in-part of application No. PCT/EP2008/010402, filed on Dec. 8, 2008.

(30) Foreign Application Priority Data

Dec. 6, 2007 (DE) .................. 10 2007 058 829

(51) Int. Cl.
H01L 21/302 (2006.01)
C09K 13/02 (2006.01)
C11D 11/00 (2006.01)
C11D 7/06 (2006.01)
C11D 7/26 (2006.01)
C11D 7/32 (2006.01)

(52) U.S. Cl.
CPC .............. C11D 11/0047 (2013.01); C11D 7/06 (2013.01); C11D 7/26 (2013.01); C11D 7/32 (2013.01)
USPC .............. 216/83; 216/24; 216/99; 134/1.3; 134/2; 252/79.1; 252/79.4; 252/79.5; 438/753

(58) Field of Classification Search
None
See application file for complete search history.

(56) References Cited

U.S. PATENT DOCUMENTS 3,160,539 A 12/1964 Hall et al.
3,607,477 A 9/1971 Rao et al.
3,720,621 A * 3/1973 Smeets .................... 510/372
4,578,209 A * 3/1986 Hisamoto et al. ......... 510/412
5,972,862 A 10/1999 Torii et al.
5,989,353 A 11/1999 Skee et al.
6,399,552 B1 6/2002 Lee
6,451,218 B1 9/2002 Holdermann
6,514,921 B1 2/2003 Kakizawa
6,546,939 B1 4/2003 Small
6,730,644 B1 5/2004 Ishikawa et al.
2001/0018407 A1 8/2001 Kakizawa
2004/0161933 A1 8/2004 Takashima
2005/0181961 A1 8/2005 Misra
2005/0247674 A1* 11/2005 Kubelbeck et al. ......... 216/92
2006/0166847 A1 7/2006 Walker
2007/0120090 A1* 5/2007 Mueller et al. ............ 252/79.1
2007/0181534 A1* 8/2007 Kamimura .................. 216/88
2010/0068889 A1 3/2010 Stockum et al.

FOREIGN PATENT DOCUMENTS

| DE | 1913616 A | | 10/1969 | |
|---|---|---|---|---|
| DE | 1924332 A | * | 8/1978 | ............... C11D 1/72 |
| DE | 19811878 A1 | | 9/1999 | |
| DE | 10051052 A1 | | 4/2002 | |
| DE | 69735126 T2 | | 8/2006 | |
| DE | 60024707 T2 | | 9/2006 | |
| EP | 0827188 A2 | | 3/1998 | |
| EP | 1284306 A2 | | 2/2003 | |
| WO | 9845399 A1 | | 10/1998 | |
| WO | 02065538 A2 | | 8/2002 | |
| WO | 2004032218 A1 | | 4/2004 | |
| WO | 2005031837 A1 | | 4/2005 | |
| WO | 2008052636 A1 | | 5/2008 | |

OTHER PUBLICATIONS

European Search Report for corresponding application 08856592.4, dated Jul. 8, 2011.
Office Action for corresponding Chinese Application 200880119284.9, dated Nov. 1, 2012.
D. C. Burkman, D. Deal, D. C. Grant, C. A. Peterson: "Aqueous Cleaning Processes" in "Handbook of Semiconductor Wafer Cleaning Technology" Noyes Pub., Park Ridge, NJ, USA (1993) pp. 111-129, no month available.
O. Doll: "Komplexbildner fir alkalische Reinigungslösungen von Halbleitersilicium-Oberflächen: Aspekte ihrer Wirksamkeit and ihrer chemischen Stabilität", (Complex formers for alkaline cleaning solutions of semiconductor silicon surfaces: aspects of their efficacy and their chemical stability), PhD Thesis, Frankfurt/Main (2005)), no month available.
Office Action for corresponding German Application 102007058829.3, dated Sep. 3, 2008.
Römpp Lexikon Chemie {Römpp's Lexicon of Chemistry}, key word: "polyethylene glycols," Version: 3.2. URL: http://www.roempp.com [searched on Sep. 2, 2008].

(Continued)

Primary Examiner — Anita Alanko
(74) Attorney, Agent, or Firm — Timothy X. Gibson, Esq.; Gibson & Dernier LLP

(57) ABSTRACT

A liquid agent for the surface treatment of monocrystalline wafers, which contains an alkaline etching agent and also at least one low-volatile organic compound. Systems of this type can be used both for the cleaning, damage etch and texturing of wafer surfaces in a single etching step and exclusively for the texturing of silicon wafers with different surface quality, whether it now be wire-sawn wafers with high surface damage or chemically polished surfaces with minimum damage density.

20 Claims, No Drawings

(56) References Cited

OTHER PUBLICATIONS

International Search Report for corresponding application PCT/EP2008/010402, dated May 27, 2009.
Written Opinion for corresponding application PCT/EP2008/010402, dated May 27, 2009.
Office Action for corresponding Chinese Patent Application No. 200880119284.9, dated Jun. 1, 2013.
Office Action and translation for corresponding Korean Patent Application No. 10-2010-7014188, dated Jul. 15, 2014.
Chinese Office Action and translation for corresponding Chinese Patent Application No. 200880119284.9, dated Feb. 8, 2014.
Chinese Office Action for corresponding Chinese Patent Application No. 200880119284.9, dated Aug. 5, 2013.

* cited by examiner

TEXTURING AND CLEANING AGENT FOR THE SURFACE TREATMENT OF WAFERS AND USE THEREOF

CROSS-REFERENCE TO RELATED APPLICATIONS

This application is a continuation-in-part of International Application PCT/EP2008/010402 filed Dec. 8, 2008 and claims priority benefit of German Patent Application DE 10 2007 058 829.3 filed Dec. 6, 2007, the entireties of which are incorporated by reference herein.

FIELD OF THE INVENTION

The invention relates to a liquid agent for the surface treatment of monocrystalline wafers, which contains an alkaline etching agent and also at least one low-volatile organic compound. Systems of this type can be used both for the cleaning, damage etch and texturing of wafer surfaces in a single etching step and exclusively for the texturing of silicon wafers with different surface quality, whether it now be wire-sawn wafers with high surface damage or chemically polished surfaces with minimum damage density.

BACKGROUND

In prior production methods, the wafer cleaning of the slurry residues after the wire-sawing and the wafer texturing are completed in two different process chains. Both processes are implemented operationally by wafer producers and solar cell producers. Slurry wafer cleaning is effected immediately after the wire-sawing by the wafer producers. It essentially comprises removing contamination applied on the wafer surface by the wire-sawing. There is included therein above all the abrasion of silicon and also of the components of the wire and the grinding agent and adhesive used (slurry). The cleaned wafers, after leaving the cleaning unit, have a more or less intensive crystalline damage to the surface which must be removed in a further process step.

The texturing of the wafer surface, if it has been implemented at all, falls within the remit of solar cell producers. Preceding this, during production of highly efficient solar cells, is a complex three-part subsequent cleaning step which follows the wafer subsequent cleaning in the chip industry. This RCA cleaning (D. C. Burkman, D. Deal, D. C. Grant, C. A. Peterson: "Aqueous Cleaning Processes in Handbook of Semiconductor Wafer Cleaning Technology, Science", Technology and Applications, East Windsor, N.J., USA (1993) pp. 111-129) comprises:
1.) Oxide etching with $HF/HNO_3$;
2.) SC-1 cleaning with $H_2O/NH_4OH/H_2O_2$ with subsequent HF dip;
3.) SC-2 cleaning with $(H_2O/HCl/H_2O_2)$ which removes the contamination and residual metallic and organic contaminants, which are applied on the wafer surface by the transport, after the pre-cleaning by the wafer producers (Figure 1a).

After each chemical treatment, the wafers pass through another rinsing step with highly pure, deionised water before moving to the next etching solution. In this way, a total number of tanks of approx. 8 is the rule solely for the RCA cleaning (O. Doll: "Komplexbildner für alkalische Reinigungslösungen von Halbleitersilicium-Oberflächen: Aspekte ihrer Wirksamkeit und ihrer chemischen Stabilität", (Complex formers for alkaline cleaning solutions of semiconductor silicon surfaces: aspects of their efficacy and their chemical stability), PhD Thesis, Frankfurt/Main (2005)) with small deviations by the various producers.

In the case of commercial solar cells, the wafers cleaned by the wafer producers of the slurry move directly into the texturing process which, in the case of basic texturing according to the prior state of production of commercial solar cells, is implemented on an industrial scale in a batch unit and serves simultaneously also as damage etch. However, it is also possible that the damage etch is implemented as a separate process step before the texturing. After applying the texturing, the wafers are subjected to an HCl and HF dip for respectively up to one minute before the emitter diffusion is implemented (Figure 1b). The HCl dip is intended to neutralise the residues of KOH solution remaining on the wafer surfaces and to stop their further chemical attack on the wafer surface. Likewise, the metallic impurities deposited by the alkaline etching solution in addition on the silicon surface, above all the poorly soluble hydroxides, precipitated from the basic solution, of the trivalent metal ions $Fe^{3+}$ and $Al^{3+}$, are intended to be brought again into solution. The HF dip is intended to ensure removal of the native oxide present on the wafers after the texturing step.

The wafer cleaning has been performed to date by two method routes: either in a batch or in an inline process, respectively two units, one for the slurry cleaning and one for the texturing, being used. To date a batch process has been the industrial standard for wafer texturing. Also different chemical systems are thereby used for cleaning and texturing: only weakly basic agents (pH 8-9) which contain cleaning surfactants for the cleaning, and strongly basic agents (pH>13) which contain texture surfactants for the texturing. Cleaning surfactants and texturing surfactants are not identical in the case of previous solar cell processing. In both cases, the pH of the agents is regulated via the addition of alkali hydroxides (generally NaOH in the cleaning and KOH in the texturing).

In the case of the batch cleaning process, the contaminated wafers pass through chemical tanks of a different composition in defined portions. Generally, aqueous alkaline agents based on potassium- or sodium hydroxide with different surfactant additives serve as cleaning agents. Chemical and ultrapure water cascades make use of the dilution effect as an essentially physical principle during cleaning, which dilution effect results when the wafers move through a large number of tanks. The process time for a batch, comprising all those partial steps from wafer separation after the wire-sawing up to the finished cleaned wafer, is generally more than one hour here.

Inline cleaning ensures a tighter temporal course in which the wafers are conveyed over a roller system in the manner of a conveyor belt, said wafers being subjected in the various portions of the cleaning bank, which are not delimited from each other strictly, to variable chemical and physical conditions. Inline cleaning, unlike batch cleaning, is a continuous process. It enables continuous exchange of the cleaning agents in parallel for cleaning without interruption of the process and improved agent control. From a chemical point of view, similar cleaning agents are used here as in batch cleaning.

For texturing of the surface of monocrystalline silicon wafers, generally an alkaline agent comprising potassium hydroxide and 2-propanol is used in the case of solar cell production. In order to ensure sufficient etching removal for removing the sawing damage, etching times in the range between 15 and 25 minutes are normal, for which reason production plants are used exclusively in the batch process. In the case of texturing, the anisotropy of alkaline etching agents is used in the etching behaviour of different crystal directions in the silicon in order to produce so-called "randomly distributed pyramids", "random pyramids". As further alkaline etching agents in addition to KOH, furthermore sodium hydroxide, tetramethylammoniumhydroxide and ethylenediaminepyrocatechol are mentioned, the organic etching agents mentioned here differing above all from both inorganic ones in a longer processing time, however the trade-off is they have no metallic cations. Potassium hydroxide is preferred relative to sodium hydroxide in the case of the inorganic etching agents, because the sodium ions remaining on the surface after the texturing can act, because of their higher diffusion rate relative to the larger potassium ions, as mobile charge carriers in the surface oxide of the silicon wafers. This has a negative effect on the electrical properties of above all oxide-passivated silicon substrates.

SUMMARY OF THE INVENTION

Starting herefrom, it was the object of the present invention to provide an aqueous chemical system which allows simpler processing (cleaning, damage etch and texturing) in solar cell production. This likewise includes technical simplification and cost reduction associated therewith in the production process.

This object is achieved by the liquid texturing and cleaning medium having the features disclosed and described herein. The further disclosures reveal advantageous developments. Uses according to the invention are disclosed and described herein.

Texturing solutions normally comprise a hydroxide ion supplier (OH⁻ ions), which concerns an organic or inorganic base and a surface-active substance, a so-called surfactant, which is normally an organic solvent, predominantly 2-propanol, in the case of the solar cell production process.

The chemical attack on the silicon in a basic aqueous medium, shown here in the example of potassium hydroxide solution, follows the reaction equation:

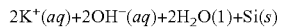

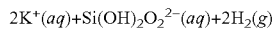

Water soluble salts of silicic acid are produced as reaction products here: potassium silicate and elementary hydrogen which, after exceeding the saturation limit in the solution, escapes from the latter as a gas.

The surfactant has available at least one hydrophilic and at least one hydrophobic group. In the case purely of the texturing process, it has two essential tasks:

1. Because of its double character as water-soluble hydrophilic and hydrophobic substance, it is able both to wet completely hydrophilic and hydrophobic silicon substrates. If the silicon surface is subjected for example, before the texturing step, to a polishing etch with agents containing hydrofluoric acid, then the surface is terminated with hydrogen atoms, i.e. those valences of the surface atoms on which no further silicon atoms abut, are saturated with hydrogen. Because of the low electronegativity difference between silicon and hydrogen, these bonds are non-polar; such a surface is correspondingly hydrophobic. In contrast, if the surface has available a thin layer of native oxide, as is formed for example in the case of newly sawn wafers, whilst the latter are subjected to moist slurry during the wire-sawing process, then the surface is predominantly hydrophilic because of the strong polarity of the Si—O bond which originates from the high electronegativity difference between silicon and oxygen.

Complete and uniform wetting of the surface is indispensable for the formation of a uniform texture of the silicon substrate. If uniform wetting of the surface is not provided, then different regions of the substrate surface are subjected to the chemical attack of the etching agent to greatly differing degrees, which results in the formation of etching pyramids of greatly varying size. In addition to a higher reflection degree, these surfaces also have the disadvantage of more difficult processibility and therefore are undesired in the solar cell production process.

2. Organic liquids generally have available a higher solubility, by a multiple, of non-polar gas molecules than the polar solvent water. This results in turn in the hydrogen, which is formed during the etching process with hydroxide ions, dissolving better also in the absorbed surface film comprising organic solvent and hence being retained longer on the surface than in a purely aqueous solution. The result is high covering of the silicon surface with ultrafine gas bubbles which act as nuclei for the formation of textured pyramids.

One theory for surface texturing of silicon substrates implies that ultrafine gas bubbles which are adsorbed on the surface block locally and temporarily the etching attack of hydroxide ions on the substrate. At the places where gas bubbles adhere, the attack accordingly takes place with a delay, whilst the surroundings around the gas bubbles are already removed. The blocked places later form the peaks of the forming etching pyramids. Although this theory about the course of the etching process is not supported unanimously, very extensive agreement prevails nevertheless in the literature about the necessity for strong and uniform absorption of the formed hydrogen on the substrate surface as a prerequisite for the formation of a qualitatively high-value texture.

For example various alkyl groups, vinyl groups or aromatic systems, e.g. phenyl radicals, serve as hydrophobic groups in surfactants. Also combinations of these groups are possible, such as for instance in the case of toluenesulphonic acid which has a benzene ring with a methyl side chain.

Hydrophilic groups are for example hydroxy groups (—OH), such as in the case of the standard texturing agents, isopropanol, SO₃H groups, as in the case of toluenesulphonic acid, nitro groups (—NO₂), carboxyl groups (—COOH), phosphate radicals (—O—PO₃H) or ammonium radicals (—NH₄⁺), to mention but a few possibilities.

The type and length of the hydrophobic and hydrophilic radicals determine the wetting and gas solubility properties of the surfactants, just as their boiling point.

The longer for example the hydrophobic radical of the surfactant, the stronger are the van der Waals forces which act between the molecules of the surfactant and the higher is its boiling point. Isopropanol which has available only two short-chain (methyl) groups has therefore a relatively low boiling point of 82° C., whilst p-toluenesulphonic acid with its longer hydrophobic radical only boils at 140° C.

The higher the non-polar, hydrophobic proportion in the surfactant molecules, the higher is also its solubility capacity for non-polar (hydrogen) gas molecules.

In addition to uniform wetting of the surface of the wafer to be textured and its assistance in the gas absorption on the wafer surface, surfactants also make a further important contribution in the processing of the solar cell wafers: they act as effective cleaning agents for the wafers in that they bond organic impurities, for example floating particles or organic residues, from the slurry, such as for instance polyethylene glycol, epoxy resins, or adhesive residues, in the aqueous solution and consequently prevent deposition thereof on the substrate surface.

Inorganic, metallic impurities can likewise be bonded very effectively by some organic reagents which are used here as texturing agent.

The isolation of the organic contaminants in solution is effected via micelle formation. Micelles are spherical agglomerates of surfactant molecules, in the centre of which the generally non-polar organic impurity is situated, surrounded by the non-polar radicals of the surfactant molecules. The polar radicals of the surfactant molecules which form the surface of the micelles ensure the solubility of the micelles in the polar solvent water.

The capacity for micelle formation is not equally pronounced in all surface-active substances. It is dependent inter alia upon the constitution of the hydrophobic radical, above all its spatial extension. For this reason, for example isopropanol with its two very short hydrophobic radicals is a very poor micelle former, whilst long-chain carboxylic acids or the anions thereof, the standard components of many cleaning agents, are very good micelle formers.

With increasing chain length of the hydrophobic radical, the water solubility of the surfactant drops. Long-chain carboxylic acids (with chain lengths of more than 6 C-atoms) are therefore increasingly more poorly water-soluble. They are in fact good micelle formers but poor texturing agents, the latter inter alia also for the reason that they are frequently no longer able to wet the silicon surface completely and uniformly. The reasons for this are, on the one hand, their poor adhesion to hydrophilic regions of the substrate surface relative to the molecule size thereof just as much as the greatly reducing solubility in the polar medium water, as a result of which the concentration of dissolved surfactant molecules become so low with larger hydrophobic chain lengths that it no longer suffices for complete covering of the substrate surface. With respect to the wetting properties, long- and short-chain surfactants, ionic and non-ionic, act in a complementary manner. For this reason, it is presented as sensible to use different types of surfactants in parallel when aiming for as high and homogeneous substrate coverings as possible.

The mixture ratio between surfactants with long-chain and short-chain hydrophobic radicals, just as the mixture ratio between ionic and non-ionic surfactants determines the pyramid growth and also the texture quality.

Toluenesulphonic acid for example hereby represents in contrast a good compromise between texturing effectiveness and cleaning effect. Unlike the long-chain carboxylic acids, it is soluble in water in a high concentration and therefore can be used in a wide concentration range. The same applies to some short-chain (hydroxy-)carboxylic acids and -dicarboxylic acids with and without supplements of a more volatile organic component, for instance a short-chain alcohol.

Aromatic alcohols, such as for example catechol (1,2-dihydroxybenzene), some dicarboxylic acids, e.g. oxalic acid and hydroxycarboxylic acids, e.g. tartaric acid, just as numerous aminocarboxylic acids, such as for example EDTA (ethylenediaminetetraacetic acid, TITRIPLEX III) and CDTA (trans-1,2-cyclohexanediaminetetracetic acid, TITRIPLEX IV), DTPA (diethylenediaminepentaacetic acid, TITRIPLEX V), are able in addition to form chelate complexes with some metal ions in a basic aqueous solution, which chelate complexes contribute to the fact that these metal ions are no longer absorbed on the wafer surface or are deposited as poorly soluble salts, but remain in solution.

Tartaric acid forms for example, with the metal ions $Fe^{3+}$, $Al^{3+}$, $Cr^{3+}$, $Pb^{2+}$, $Cu^{2+}$, very stable chelate complexes and consequently increases the solubility thereof in basic solutions from which these are precipitated in the absence of the chelate former as poorly soluble hydroxides.

The cleaning effect of these organic compounds both on the solution and silicon substrate surfaces is known in semiconductor technology.

Toluenesulphonic acid is a surfactant main component of the wafer cleaning agent PURATRON® 67 by the company ICB GmbH & Co. KG. Alkylsulphonic acids in general and also their alkyl- and (poly-)alkoxy-substituted derivatives are known as cleaning surfactants and not as substances effective for texturing.

According to the invention, a texturing agent for the surface treatment of monocrystalline wafers is likewise provided. This texturing agent contains at least one alkaline etching agent for monocrystalline silicon and at least one low-volatile organic compound with a boiling temperature of more than 110° C., preferably more than 120° C. and particularly preferred more than 150° C. The texturing agent according to the invention has the advantage that higher process temperatures tend to be able to be used here, e.g. temperatures above 110° C., in comparison with those methods in which exclusively volatile texturing agents are used since here temperatures of approx. 80° C., the approximate boiling point of isopropanol (82° C.) and ethanol (78° C.), are standard. Higher process temperatures thereby ensure a faster etching attack of the cleaning and texturing agent without the danger of rapid outgassing of the components and consequently reduce the process times.

On the other hand, high process temperatures also promote however the undesired diffusion of some metallic impurities from the solution into the silicon substrate if the latter are not bonded already in the solution, e.g. by complex formation. Furthermore, some of the low-volatile texturing agents are relatively cheap to purchase and at the same time are biodegradable since many of these compounds concern natural substances, which likewise reduces the process costs.

DETAILED DESCRIPTION OF THE INVENTION

Preferably, the low-volatile organic compound has a boiling temperature of ≥120° C., particularly preferred ≥150° C.

The at least one low-volatile organic compound is preferably selected from the group comprising saturated or unsaturated aliphatic or aromatic carboxylic acids, dicarboxylic acids, polycarboxylic acids, hydroxy(poly-)carboxylic acids, aminocarboxylic acids (of the general formulae as presented in I.1-I.3), the esters thereof and also mixtures hereof. There are hereby used in particular compounds from the group comprising oxalic acid, malonic acid, maleic acid, succinic acid, adipinic acid, malic acid, tartaric acid, lactic acid, citric acid, phthalic acid, teraphthalic acid, salicylic acid, nitrotriacetic acid (NTA), ethylenediaminetetraacetic acid (EDTA), diethylenetriaminepentaacetic acid (DTPA), trans-1,2-cyclohexanediaminetetraacetic acid (CDTA) and also mixtures hereof.

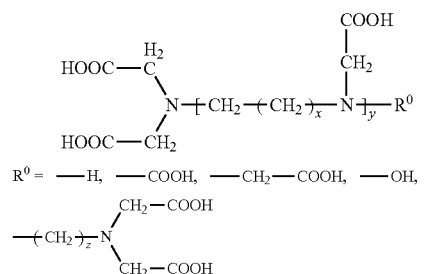

$x, y, z = 0-12$

I.1: Chain-Like Aminocarboxylic Acids

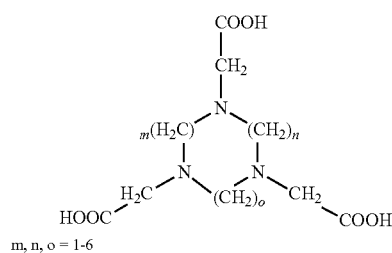

I.2: Ring-Like, Heterocyclic Aminocarboxylic Acids

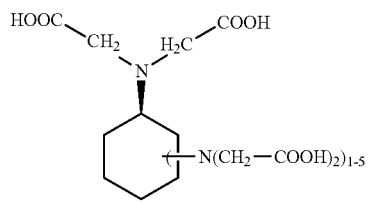

I.3: Aminocarboxyl Radicals Substituted on Cyclohexane

It is preferred that the low-volatile organic compound is a linear, branched or cyclic alcohol or an ester thereof.

The low-volatile organic compound can be an isomer of pentanol or hexanol, preferably 1-pentanol, 2-pentanol, 3-pentanol, 1-hexanol, 2-hexanol or 3-hexanol, or an ester thereof.

The low-volatile organic compound can be comprised in an amount of 0.01 to 5 wt-%, preferably 0.1 to 1 wt-%, more preferably 0.15 to 0.25 wt-%.

It is possible to combine the low-volatile alcohol or ester with other low-volatile compounds.

There are preferably in the texturing and cleaning agent as low-volatile organic compound, saturated or unsaturated aliphatic (poly)alcohols, in particular selected from the group comprising straight-chain, branched or cyclic $C_4$-$C_8$ diols or $C_6$-$C_{12}$ triols or mixture hereof. Particularly preferred are 1,5-pentanediol, 1,6-hexanediol, cis/trans-1,X-cyclopentanediol (X=2, 3), cis/trans-1,X-cyclohexanediol (X=2, 3, 4), cis/trans-1,X-cycloheptanediol (X=2, 3, 4), cyclohexanetriols, cycloheptanetriols, cyclononanetriols, in particular 1,4,7-cyclononanetriol, cis/trans-1,4-cyclohexanediol or mixtures hereof.

Cis/trans-1,4-cyclohexanediol may be stressed as a particularly preferred representative from the series of low-volatile alcohols. Because of its extremely rapid texturing effect on silicon substrates, inline texturing is made possible at all for the first time, which is not possible with the previous standard texturing agent 2-propanol, in particular because of the high volatility of 2-propanol and the instability of the bath composition resulting therefrom.

The cleaning effect of the (poly)alcohols is based, on the one hand, on the fact that polyalcohols are good solvents for organic impurities. On the other hand, hydroxy groups can complex, in cis position relative to each other, metal ions as -ligands and, in this way, prevent their redeposition on the wafer surface. The metal-oxygen bond in the case of (poly)alcohols is stabilised, in contrast to simple alcohols, in addition by an intropy effect.

The at least one low-volatile organic compound is thereby used preferably in a concentration of 1 to 20% by weight, particularly preferred 2 to 10% by weight, respectively relative to the total texturing agent.

A further preferred variant provides that there are used as low-volatile organic compounds, those from the group of aromatic sulphonic acids or aromatic (poly-)alcohols, e.g. resorcin or catechol, or aromatic ethers which can be substituted possibly either by non-polar side chains, for instance one or more alkyl- (e.g. ethyl-, propyl-, octyl-, isopropyl-, ter-butyl, etc.), alkyleneoxide- (e.g. ethyleneoxide- or polyethyleneglycoloxide-), alkylvinyl groups, or by polar side chains, for instance hydroxyl groups, —$SO_3H$ groups, carboxyl groups, —SH groups, amino groups. Particularly preferred from the group of aromatic sulphonic acids with an alkyl side chain is toluenesulphonic acid, whilst a preferred representative from the group of alkoxyl-substituted aromatic alcohols is 1,3-dihydroxy-4-ethoxybenzene. As preferred representatives from the series of aromatic, alkyl-substituted (poly-)ethers, there may be mentioned here Triton X-100® (polyethyleneglycol-tert-octylphenylether), Tergitol NP-9 (various alkyl-phenylethyleneglycols) (both by Union Carbide Corporation) and also nonylphenylethoxylate with the trade name Triton N-57® (manufacturer: Rohm & Haas) (see II.1 to II.2). It was able to be verified experimentally that toluenesulphonic acid itself in a higher concentration (above 3% relative to the entire texturing agent) shows, in texturing agents with a somewhat increased alkalihydroxide content, e.g. between 5 to 10% by weight, a strong texturing effect which is not observed in systems with low contents of alkalihydroxide and toluenesulphonic acid.

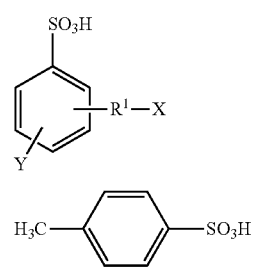

2-1 p-toluenesulphonic acid
component of PURATRON 67.

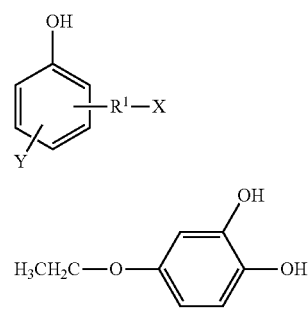

2-2

1,2-dihydroxy-4-ethoxybenzene

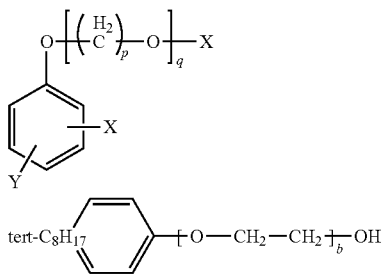

2-3 polyethyleneglycol-tert-octylphenylether
component of TRITON X-100
P=0–12; Q=0–12

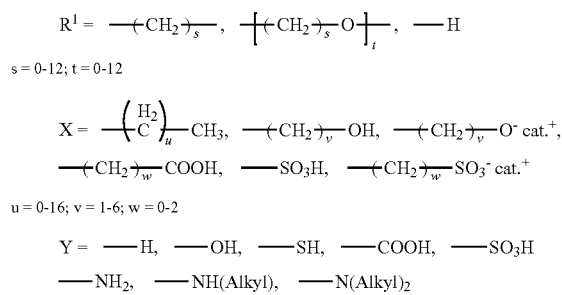

II.2: Substituted Aromatic Sulphonic Acids, Alcohols and Ethers with Respectively One Preferred Representative The treatment solution thereby contains preferably 0.1 to 10% by weight of the sulphonic acid.

A further preferred variant provides that there are used as low-volatile organic compounds, those from the group of sulphuric acid alkyl esters and also the salts thereof. Particularly preferred here are laurylsulphates, myristylsulphates, stearylsulphates, caprylsulphates, e.g. sodium laurylsulphate, potassiumlaurylsulphate, ammoniumlaurylsulphate, ammoniumcaprylsulphate (cf.: III).

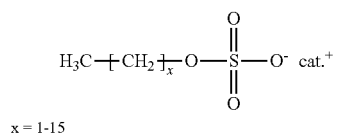

General Formula of Alkylsulphates

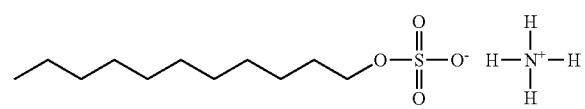

ammoniumlaurylsulphate
laurylsulphates are components of the surfactant SDS

III: Alkylsulphates with Ammoniumlaurylsulphate as a Preferred Representative

In a further preferred embodiment, polysorbates are used as low-volatile organic compounds (cf.: IV). A particularly preferred representative of this substance group is polyoxyethylenesorbitanmonolaurate, commercially available under the trade name TWEEN® 20 (Uniqema, ICI Americas. Inc.) with high purity.

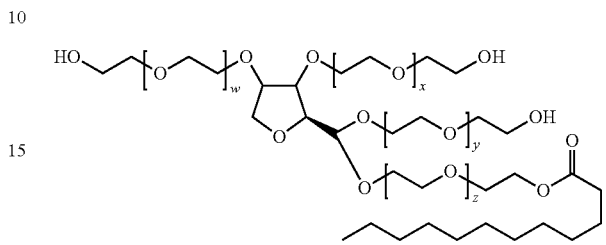

Polysorbate 20: w+x+y+z=16
polyethylenesorbitanmonolaurate
TWEEN 20

IV: Polysorbates with Polysorbate 20 (TWEEN® 20) as Preferred Representative

As etching agent, the texturing agent according to the invention preferably contains a compound selected from the group comprising sodium hydroxide, potassium hydroxide, tetramethylammoniumhydroxide, ethylenediaminepyrocatechol and mixtures hereof.

Preferably, the etching agent, the hydroxide-ion supplier, is contained in a concentration of 4 to 15% by weight, relative to the total texturing agent, in particular 5 to 7% by weight.

In addition the texturing agent can contain at least one high-volatile organic component, in particular a high-volatile, linear or branched alcohol with a boiling temperature of at most 120° C. The high-volatile alcohol is preferably selected from the group comprising methanol, ethanol, n-propanol, isopropanol, n-butanol, sec-butanol, isobutanol, tert-butanol and mixtures hereof. The high-volatile alcohol is preferably in a concentration of 2 to 20% by weight, in particular 2 to 10% by weight, relative to the total texturing agent.

Furthermore, the treatment solution can preferably contain a further surfactant. This is used according to the invention in order to achieve a further, this time large-area homogenisation of the chemical attack of the wafer surface and consequently an improvement in the optical quality of the wafer. This optical homogeneity, with respect to the aesthetics of the wafers, is of particular importance, which is a crucial price factor for industrial solar cells in commercial solar cell production.

The surfactant is preferably selected from the group comprising sodium laurylsulphate, polyethyleneglycol, polyethyleneglycoloctylphenylether and mixtures hereof. The surfactant can thereby be contained in a concentration of 1 to 20% by weight, in particular 2 to 10% by weight, relative to the total treatment solution.

The texturing agent can be used preferably in the immersion etching process which can be implemented as a continuous or batch method.

The texturing agent preferably has a viscosity in the range of 0.3 to 1000 mPa·s, preferably of 0.5 to 100 mPa·s and particularly preferred of 0.6 to 10 mPa·s.

The method according to the invention is intended to be explained in more detail with reference to the subsequent example without wishing to restrict said method to the special embodiments shown here.

Example 1

Cleaning, Damage Etch and Texturing in One Step During the Batch Process

An example according to the invention for cleaning, damage etch and texturing in one etching step relates to a batch cleaning process in which a unit comprises four modules which are separated from each other spatially via respectively an air lock. Each module comprises an externally sealed chamber of variable length, according to the number of wafers to be processed at the same time. The chambers are opened briefly for loading and unloading, which takes at most 10 seconds per module, and have a minimum gas space, in order that the thermal and chemical equilibrium adjustment between liquid phase and gas phase can be effected rapidly.

In the individual chambers there are situated process tanks in which rails can be immersed, on which rails the wafers are fixed at the beginning of the cleaning process and on which they change from process chamber to process chamber.

In the individual modules, the following partial processes take place:

Module 1: Pre-Cleaning of the Wafers Contaminated with Slurry, with the Help of DI Water A tank is situated in the module and is emptied after each rinsing step. Cleaning agent is warm DI water at 40-80° C. The wafers are irradiated acoustically optionally during the rinsing with a megaacoustic source. Acoustic irradiation frequency is 1 MHz. The process duration is preferably 6½ min.

Module 2: Damage Etch Associated with Removal of Contamination which is Situated in the Damaged Layer+Texturing of the Wafer Surface In module 2 there is situated, analogously to module 1, at least one basin in which the wafers to be processed are fixed horizontally.

A preferred embodiment has as etching agent in module 2, a 5 percent by weight of KOH solution with 7% by weight of toluenesulphonic acid, relative to the total solution. The etching time is 20 min; the bath temperature is 110° C. The flow rate of the etching agent at the wafer surface is approx. 5 cm/min with a film thickness of 3 mm.

In contrast to the other modules in which the dwell time is approx. 6.5 min, the dwell time of the wafers in module 2 is approx. 3 times higher. In order to ensure a continuous process flow, at least three wafer rails (carriers) are processed simultaneously in module 2 and are introduced temporally offset at an interval of approx. 6 to 6.5 min into the chamber or removed therefrom.

A further embodiment provides, as etching agent for module 2, an aqueous sodium hydroxide solution with adipinic acid as texturing surfactant, the NaOH content of the solution being 6% by weight and the adipinic acid content 4% by weight, relative to the total solution. The etching time here is also 20 min; the bath temperature is 110° C. The flow rate of the etching agent at the wafer surface is approx. 4 cm/min with a film thickness of 4 mm.

Module 3: Subsequent Rinsing of the Finished Textured Wafers with DI water

The object of this process step is the removal of any remaining etching solution residues on the wafers from module 2.

A preferred embodiment of the invention provides the same constructional configuration of module 3, as is present in module 1. The process parameters (process time, process temperature, acoustic irradiation of the tanks) are thereby likewise identical to those of module 1.

In a further embodiment of the invention, the wafers are cleaned of the etching solution residues by means of a spray device. The process duration then is however only 3-3½ min.

Module 4: Shortened RCA Cleaning

The object of this cleaning step is the removal of any entrained residues of metallic and organic contaminants on the wafer surface.

In a preferred embodiment of the invention, module 4 comprises two tanks. The first tank is filled with an aqueous ammonium hydroxide ($NH_4OH$)/hydrogen peroxide ($H_2O_2$) solution in the concentrations which are normal for RCA cleaning. The process temperature here is preferably 80-90° C., the process time 6½ to 7 min.

In a further preferred embodiment, the first tank of module 4 is filled with a semi-concentrated HCl solution. The process time for the HCl dip implemented therein is approx. 2 min, the process temperature 50° C.

The second tank contains aqueous, diluted to semi-concentrated HF solution. The process temperature is 25° C. (room temperature), process duration 10-15 seconds. After leaving the tank, the wafers are subjected in module 3 to a spray process with DI water lasting 3-3½ min.

In this state, they can be further processed immediately without further cleaning steps.

Wafers treated with the present method tend to have, in a practical test, better optical properties (reduced reflection) and comparable electrical (surface charge carrier combination speed) and significantly better mechanical properties (higher resistance to breakage) than wafers processed with the standard cleaning and texturing concept.

Example 2

Cleaning and Texturing of Wire-Sawn Wafers

A further example according to the invention for texturing wire-sawn wafers with simultaneous cleaning relates to a batch process in which an etching agent is used in module 2 and, relative to the total solution, comprises up to 3.5% by weight of potassium tosylate (potassium salt of p-toluenesulphonic acid), 1% by weight of potassium tartrate (potassium salt of tartaric acid), 4% by weight of potassium hydroxide and 2% by weight of 2-propanol. The process time in module 2 is 21 to 25 minutes at approx. 80 to 85° C. bath temperature.

Example 3

Cleaning and Texturing of Wire-Sawn Wafers

A further example according to the invention for cleaning and texturing wire-sawn wafers relates to a batch process in which an etching medium is used in module 2 and comprises, relative to the total solution, up to 3.5% by weight of potassium tosylate, 1% by weight of ammonium citrate, 5% by weight of potassium hydroxide, 3.5% by weight of 2-propanol and 0.5% by weight of Triton® X-100. The process time in module 2 is 21 to 25 minutes with a bath temperature of 82 to 85° C.

In module 4, the first tank is filled with 5% by weight of HCl solution. Bath temperature is 35° C. The immersion time is 2 minutes.

The remaining test parameters are analogous to those in embodiment 1.

Example 4

Cleaning and Texturing of Wire-Sawn Wafers

A further example according to the invention for cleaning and texturing wire-sawn wafers relates to a batch process in which an etching/cleaning solution is used in module 2 and, relative to the mass of the total solution, comprises 4% by weight of potassium hydroxide, 3.5% by weight of potassium tosylate, 2.5% by weight of 2-propanol, 0.5% by weight of sodium laurylsulphate and 0.25% by weight of EDTA (ethylenediaminetetraacetate).

In module 4, the first tank is filled with 5% by weight of HCl solution. Bath temperature is 35° C. The immersion time is 2 minutes.

The remaining test parameters are analogous to those in embodiment 1.

The remaining process parameters for the other modules correspond to those of embodiment 1.

Example 5

Cleaning and Texturing of Wire-Sawn Wafers

A further preferred example for texturing wire-sawn wafers with simultaneous cleaning relates to a batch process in which an etching agent is used in module 2 and, relative to the entire solution, comprises 1% by weight catechol, 4% by weight potassium tosylate, 5% by weight potassium hydroxide. The process time in module 2 is 21 to 25 minutes at approx. 100 to 110° C. bath temperature (varying).

Example 6

Texturing of Polished Wafers

An example according to the invention for texturing polished wafers relates to a batch process in which the system required for the processing comprises four tanks.

In tank 1, the polished (already very clean) wafers are immersed in pure alcohol, preferably isopropanol. The temperature of the alcohol is between 20 and 25° C. This step serves exclusively for uniform wetting of the surface even before the first chemical attack by the etching solution in tank 2. The wafers change from bath 1 to bath 2 in the dripping state.

Tank 2 contains the actual texturing solution comprising 5% by weight of KOH, 3.5% by weight of p-toluenesulphonic acid and 3.5% by weight of 2-propanol, relative to the total solution. The bath temperature during the etching process varies between 80 and 85° C. The etching time is between 40 and 50 minutes, according to the tank temperature (at etching temperatures around constantly 85° C., it is approx. 40 min).

Tank 3 contains an approx. 5 to 6% by weight of hydrochloric acid solution with a temperature of approx. 20 to 25° C. After leaving tank 2, the wafers are sprayed briefly with deionised water before they change to bath 3 where they remain for approx. 1 to 2 minutes.

Process step 3 in tank 3 serves for neutralisation of any remaining KOH residues on the wafer surface and hence for stopping the etching.

After leaving tank 3, the wafers change to a fourth tank with pure, deionised water where they are rinsed up to the conductance of the deionised water.

A wafer surface textured in this way, in the practical experiment, reached a reflection degree of approx. 10.8% (weighted reflection).

Example 7

Texturing of Polished Wafers

A further example according to the invention for texturing polished wafers provides, with otherwise identical parameters to the preceding example as etching constituents for tank 2, an aqueous solution with 5% by weight of potassium hydroxide and 7% by weight of potassium tosylate (potassium salt of toluenesulphonic acid). The bath temperature here is approx. 95 to 100° C., the etching time 30 to 40 minutes.

Example 8

Texturing of Polished Wafers

A further example according to the invention for texturing polished wafers provides as etching formulation for tank 2, an aqueous solution of, relative to the total solution, 5% by weight of KOH and 2% by weight of adipinic acid diethylester. The bath temperature is approx. 80° C., the etching time at most 50 minutes. The test parameters for the baths 1, 3 and 4 are analogous to those of example 1.

The formulations represented in example 2 and 3 and reaction conditions for tank 2 are suitable also as etching agents for module 2 with a cleaning/texturing process for wire-sawn wafers contaminated with grinding agent.

Example 9

Texturing of Polished Wafers

In a further example according to the invention, the use of 2-propanol in the texturing process is dispensed with entirely. Tank 1 contains here, instead of pure 2-propanol, a warm p-toluenesulphonic acid solution at approx. 40° C. with 20 to 30% by weight of toluenesulphonic acid.

A wafer surface textured in this way, in the practical experiment, achieved a reflection degree of approx. 11.3% (weighted reflection).

The invention claimed is:

1. A liquid texturing and cleaning agent for the surface treatment of monocrystalline wafers comprising at least one alkaline etching agent for monocrystalline silicon and at least one low-volatile organic compound with a boiling temperature of more than 110° C., wherein the texturing and cleaning agent comprises a viscosity in the range of 0.5 to 100 mPa·s and wherein the low-volatile organic compound is selected from the group consisting of
   a) ethylenediaminetetraacetic acid (EDTA), 1,2-cyclohexanediaminetetraacetic acid (CDTA), and salts thereof;
   b) polysorbate, polyethylenesorbitan-monolaurate;
   c) possibly substituted aromatic sulphonic acid and possibly substituted aromatic dialcohol;
   d) (poly)alcohol selected from the group of straight-chain, branched or cyclic $C_4$-$C_8$ diols, straight-chain, branched or cyclic $C_6$-$C_{12}$ triols;
   and mixtures thereof.

2. The texturing and cleaning agent according to claim 1, wherein the low-volatile organic compound has a boiling temperature of at least 120° C.

3. The texturing and cleaning agent according to claim 1, comprising the low-volatile organic compound in an amount of 0.01 to 5 wt-%.

4. The texturing and cleaning agent according to claim 1, wherein the (poly)alcohol is selected from the group consisting of 1,5-pentanediol, 1,6-hexanediol, cis/trans-1,X-cyclopentanediol (X=2, 3), cis/trans-1,X-cyclohexanediol (X=2, 3, 4), cis/trans-1,X-cycloheptanediol (X=2, 3, 4), cyclohexanetriols, cycloheptanetriols, cyclononanetriols, in particular 1,4,7-cyclononanetriol, cis/trans-1,4-cyclohexanediol and mixtures hereof.

5. The texturing and cleaning agent according to claim 1, wherein the organic compound comprises a concentration of, relative to the total texturing and cleaning medium, 1 to 20% by weight.

6. The texturing and cleaning agent according to claim 1, wherein the sulphonic acid or the aromatic dialcohol comprises a concentration of, relative to the total treatment solution, 0.1 to 10% by weight.

7. The texturing and cleaning agent according to claim 1, wherein the organic compound is toluenesulphonic acid.

8. The texturing and cleaning agent according to claim 1, wherein the organic compound is a possibly alkyl-substituted dihydroxybenzene.

9. The texturing and cleaning agent according to claim 1, wherein the organic compound is 1,3-dihydroxy-4-methylbenzene or 1,2-dihydroxy-4-methylbenzene.

10. The texturing and cleaning agent according to claim 1, wherein the etching agent is selected from the group consisting of sodium hydroxide, potassium hydroxide, tetramethylammoniumhydroxide, ethylenediaminepyrocatechol and mixtures hereof.

11. The texturing and cleaning agent according to claim 1, further comprising at least one high-volatile linear or branched alcohol with a boiling temperature of at most 120° C.

12. The texturing and cleaning agent according to claim 11, wherein the high-volatile alcohol is selected from the group consisting of methanol, ethanol, n-propanol, isopropanol, n-butanol, sec-butanol, isobutanol, tert-butanol and mixtures hereof.

13. The texturing and cleaning agent according to claim 11, the high-volatile alcohol comprising a concentration of, relative to the total texturing and cleaning agent, 2 to 20% by weight.

14. The texturing and cleaning agent according to claim 1, further comprising at least one surfactant.

15. The texturing and cleaning agent according to claim 14, wherein the surfactant is selected from the group consisting of sodiumlaurylsulphate, polyethyleneglycol, polyethyleneglycoloctylphenylether and mixtures hereof.

16. The texturing and cleaning agent according to claim 14 the surfactant comprising a concentration of, relative to the total texturing and cleaning agent, 1 to 20% by weight.

17. A method of texturing the surfaces of monocrystalline wafers comprising applying the texturing and cleaning agent according to claim 1 thereto.

18. The method according to claim 17, wherein the wafer is a polished wafer.

19. A method of performing a simultaneous damage etch, cleaning and texturing of the surface of a monocrystalline wafer comprising applying thereto a texturing and cleaning agent according to claim 1.

20. A method of removing contaminants occurring during wire-sawing of wafers comprising applying to the wafers the texturing and cleaning agent according to claim 1.

* * * * *